United States Patent [19]

Hermann

[11] Patent Number: 5,121,118
[45] Date of Patent: Jun. 9, 1992

[54] METHOD AND APPARATUS FOR ACHIEVING CONTROLLED SUPPLEMENTAL SIGNAL PROCESSING DURING ANALOG-TO-DIGITAL SIGNAL CONVERSION

[75] Inventor: Jurgen Hermann, Mauren, Liechtenstein

[73] Assignee: Divertronic AG, Mauren, Liechtenstein

[21] Appl. No.: 435,418

[22] PCT Filed: Mar. 15, 1988

[86] PCT No.: PCT/EP88/00203
§ 371 Date: Nov. 13, 1989
§ 102(e) Date: Nov. 13, 1989

[87] PCT Pub. No.: WO89/08819
PCT Pub. Date: Sep. 21, 1989

[51] Int. Cl.$^5$ ............................................. H03M 1/00
[52] U.S. Cl. .................................. 341/118; 341/166; 364/571.01
[58] Field of Search ............... 341/126, 127, 128, 129, 341/166, 167, 168, 118, 119, 120; 364/571.01, 571.03, 571.04, 571.07; 177/25.11, 25.12, 25.13, 50; 73/58, 765, 766

[56] References Cited

U.S. PATENT DOCUMENTS

| | | | |
|---|---|---|---|
| 3,654,545 | 4/1972 | Demark | 323/75 |
| 3,681,577 | 8/1972 | Gasiunas | 341/120 X |
| 3,694,745 | 9/1972 | Thrap | 341/120 X |
| 3,733,600 | 5/1973 | Hellwarth et al. | 341/129 |
| 3,737,891 | 6/1973 | Metcalf | 341/127 X |
| 3,806,916 | 4/1974 | Diaz et al. | 341/128 |
| 3,826,983 | 7/1974 | Garratt et al. | 341/167 |
| 3,883,863 | 5/1975 | Willard | 341/167 |
| 3,979,745 | 9/1976 | Bishop | 341/140 |
| 3,982,241 | 9/1976 | Lipcon | 341/118 |
| 4,107,667 | 8/1978 | Kronlage | 340/347 |
| 4,192,005 | 3/1980 | Kurtz | 364/571 |
| 4,354,176 | 10/1982 | Aihara | 341/168 |
| 4,357,600 | 11/1982 | Ressmeyer et al. | 341/129 |
| 4,484,177 | 11/1984 | Jobbagy | 341/167 |
| 4,535,857 | 8/1985 | Haze | 177/50 |
| 4,605,920 | 8/1986 | Naisuler | 341/166 X |
| 4,705,126 | 11/1987 | Naito | 177/50 |
| 4,765,188 | 8/1988 | Krechmery et al. | 364/571.03 X |
| 4,870,863 | 10/1989 | Duncan et al. | 364/571.04 |

FOREIGN PATENT DOCUMENTS 1169414 1/1986 European Pat. Off. .
3151743 8/1982 Fed. Rep. of Germany .
83/04435 12/1983 PCT Int'l Appl. .

OTHER PUBLICATIONS

"Enhancing the dynamic range of an A/D converter", Lacey et al Electronic Engineering, Aug. 1983, pp. 49–52 and 57.

*Primary Examiner*—Howard L. Williams
*Attorney, Agent, or Firm*—Nixon & Vanderhye

[57] ABSTRACT

A transducer-system that corrects the actual output of each transducer (11) in the system so as to approximate a desired transducer output, i.e., one where the measured variable such as pressure is directly proportional to the actual physical variable. A connector (15) to each transducer (11) includes special calibration indicators for identifying any innacuracies in its output signal, and monitoring and correction circuitry (13) is selectively attachable to any of the transducers (11), to read the calibration indicators and appropriately adjust the transducers output signal, thereby correcting the identified inaccuracies. A preferred form for the calibration indicators is a set of eight resistors (R1-R8). Subsets of this set correct for zero level, span, and linearity of the transducer (11).

24 Claims, 3 Drawing Sheets

METHOD AND APPARATUS FOR ACHIEVING CONTROLLED SUPPLEMENTAL SIGNAL PROCESSING DURING ANALOG-TO-DIGITAL SIGNAL CONVERSION

BACKGROUND OF THE INVENTION

1. Field of the Invention

The disclosure concerns a process and a device for compensating for, or correcting, measurement errors, and/or signal shaping of analog measurement signals, especially for sensors such as piezo-resistive sensors, in which a transformation of analog measurement signals into digital values is undertaken.

2. Related Prior Art

Sensors, to include also piezo-resistive sensors, have been completely integrated into modern technology and form an indispensable component for a measurement, control and/or regulatory circuit. By their use, precise measurement values can be obtained and then be further processed.

In contrast to previous decades, modern sensors are available on the market at relatively favorable prices.

In practice, the problem certainly arises that, for example, the measurement signal picked off at a measurement bridge can be contaminated with many measurement errors. Further, traditional sensors can be employed in association with microprocessors only by means of expensive switching, as a result of which, in any case, the measurement signal obtained from the analog measurement circuit must first of all be subjected to an analog-digital transformation.

In order to at least permit a temperature compensation, U.S. Pat. No. 4,192,005 discloses that a measurement value compensation switch can be provided downstream from the measurement point, in order to at least compensate for the errors arising from the influence of temperature in the analog measurement signal. But even this analog temperature compensation is imperfect, based on results.

On the other hand, U.S. Pat. No. 4,192,005 discloses how to digitize an analog signal measurement signal of a piezo-resistive sensor and process it digitally, through an analog-digital converter. This leads to an extreme loss of analog-digital converter resolution, since the sensitivity and offset compensation cannot be set from the start. In other words, with this known device, the entire measurement signal, including all errors, will be digitized from the outset. In this situation, the resolution can, at the maximum, openly reflect the individual digital steps. In addition, an enormous fabrication expense and, above all, a multiplicity of storage registers is required in the downstream digital processing electronics, in order to at least begin, at the outset, to process the original analog measurement signal after its transformation in the analog-digital converter, so that at least a part of the measurement errors will be compensated from the outset. Since the fabrication cost is enormous, the use of a downstream microprocessor was recommended in this connection in the U.S. patent document mentioned above.

By comparison to the state of the art just discussed, a greatly enhanced system for measurement error compensation has been made known in EP-A 0 169 414. The measurement processing and the corresponding device set forth in this document for the accomplishment of measurement processing includes a compensation circuit working in digitized form. The measurement signals, received in analog form, are further processed in analog form in the course of which an analog measurement signal is digitized only in a regulatory circuit, in order to then call up a corresponding prestored compensation or signal-shaping value based on a calibration and feed it back into the measurement switch. By this means, for example, the power supply for the measurement bridge and/or the amplification curve in the operational amplifier connected downstream from the measurement bridge can be influenced. With the state of the art just discussed, on the other hand, far better results can be achieved than by earlier methods. Particularly, by this approach, not only can a temperature compensation be provided but, above all, a zero pint and linearity compensation of the received measurement signal can also be undertaken.

With improved switching, there are also disadvantages to the state of the art which lie in the areas of long-term instability and a relatively high energy consumption. Analog compensation with an operational amplifier necessitates relatively large power signals in the mA [milli-Amp]range, since otherwise the output signal of the operational amplifier is submerged by noise. Finally, the analog initial signal is not suited for direct further processing by means of a microcomputer, and therefore in this case an additional analog-digital converter must be provided. Finally, the expense of the calibration display is also worth consideration, since many individual calibration steps are necessary, in order to be able to execute a desired measurement error compensation.

Although the state of the art has proved itself with greatly enhanced compensation and signal-processing, in contrast to earlier solutions, disadvantages nonetheless remain.

In essence, there are the following sensor signal measurement errors which should be considered in an optimal combination process.

a) A possible measurement error concerns the "null-point displacement and scattering of the measurement value," which is caused by varying resistance values in the two arms of the measurement bridge, so that even without pressure being applied to the pressure sensor, a null-point error pressure signal appears.

b) An additional error appears through "temperature influences" which influence the null-point displacement as well as the sensitivity of the measurement bridge.

c) A further error concerns the already-mentioned linearity error. In other words, the received pressure signal is not completely linear to the applied pressure. Especially in high precision situations, a correction must be undertaken here.

d) A further error is caused by the "sensitivity distributions" of the sensor cells, which are conditioned by production tolerances, as a result of which the individual cells display different sensitivities, for which reason the measurement circuit has to be appropriately balanced.

e) In addition, the so-called "hysteresis errors" and "repetitious errors" can also appear (these can only be detected with difficulty).

f) Finally, "long-term instabilities" appear, which basically are not detected at the beginning and become increasingly larger through long-term operation a nd contaminate the null-point.

SUMMARY OF THE INVENTION

From the above, it is the task of the present disclosure to create a process and a device for measurement error compensation, correction, and signal shaping, especially for sensors such as piezo-resistive sensors. By use of the process and device a measurement signal can be received with the highest precision and exactness and then can be subjected to signal shaping in the desired direction with the inclusion of an appropriate desired signal error compensation and correction, with which one or more of the above-named error signals can be cumulatively compensated and corrected. And this is to be accomplished with a relatively simple construction. The analog measurement signal must be further digitized in the process, in order to permit additional processing by means of a microprocessor. Finally, the possibilities for variations appropriate to the technical needs and requirements must be as great as possible.

By means of the present disclosure, extraordinary, hitherto unimaginable, advantages over the current state of the art are achieved in amazing fashion.

The disclosed device represents, in addition, the connection between the sensor cells and a microprocessor, since no other component is required for conversion of the analog into digital values. In addition, the problem of compensation reduces itself to the program level, so that in individual cases, specific hardware add-ons and modifications are not necessary.

The essence of the disclosure lies in the fact that the compensation relating to the signal errors in the measurement signal and the appropriate signal shaping is undertaken neither before nor after the conversion of the analog signal into a digital signal, but during the analog signal conversion. As a result, one attains a previously unimagined precision with highest resolution, without the original measurement signal first being "added to" by compensation measures, carried out before or after the fact, and later being irretrievably contaminated.

If compensation and signal shaping is undertaken before the analog/digital conversion, an additional amplification of the original measurement signal is required, thereby requiring a higher power consumption. This leads to an additional error which is not correctable even when additional resistance balance is undertaken and expensive compensation processes and devices are employed.

Compensation of the measurement signal and appropriate signal shaping after the analog/digital conversion leads to a clipping of the original measurement signal which can not be corrected thereafter, with a loss of the error and other information. This operates in a particularly drastic fashion in low-pressure ranges of below 10 bar, and particularly below 1 bar, such that the error that arises can be up to 3 times larger than the actual original measurement signal.

In the disclosed process, the sensor and the measurement bridge (when a piezo-resistive sensor is employed) can be driven by a power supply of about 200 uA. This is, by way of example, 10 times smaller than possible under the current state of the art with an analog measurement signal refinement with digital correction processing. This is because here, as in the previous state of the art, measurement bridge power supplied of at least 2 mA are necessary, in order to get a sufficiently strong signal for further processing through the OP[operations] amplifier, which leads to the above-mentioned undesired measurement error contamination.

The disclosure can therefore be employed with an analog-digital converter, which is constructed and operated according to the so-called counter process, i.e. the "sawtooth process." Known sawtooth processes work according to the so-called single- or dual-slope processes. Three- and four-slope processes re also possible as derivations of the single-and double-slope processes. In the same fashion, a U(i)/f converter as well as a quantized-feedback or charge-balancing converter can also be employed.

In an especially preferred design of the disclosure, a dual slope integration process will be executed. This process will permit problem-free compensation of: null-point displacement, individual fluctuations in sensor sensitivity, temperature influences, as well as linear errors and also hysteresis errors.

The dual-slope process is particularly well-suited, since a three-fold compensation can be accomplished, that is to say, in the neutral phase through a level shift, in the negative slope phase through a preselected adjustment and transformation of the phase length T of the input signal integration, and in the adjoining positive slope phase through preselected adjustment and transformation of the reference voltage to be integrated.

Since the entire process in a preferred design is constructed so that it can be programmed by means of a microprocessor, maximum adaptability to existing situations is ensured. A master-slave operations mode is also possible with this, through which an attached microprocessor is controllable. The device can also be operated in stand-along mode or even in a "cascade arrangement", in which several devices are linked to each other through a microbus. Through the programmable construction of the analog-digital conversion signal-fitting process, it is possible to obtain any desirable adaptation to specific technical requirements, whereby any desired compensation values, between two prestored values, can be computed and transformed by means of the integrated microprocessor. This above all is very advantageous in the measurement of the calibration value, since as a result only a relatively small number of calibration points need to be measured, and the points lying between them can be interpolated by the computer. Further, any convenient degree of resolution can be achieved and a desired signal fit can be obtained.

Further significant advantages result from the use of an EEPROM as a switchable module. This is programmable with low power, and serves for reading out from storage all adjustment values and parameters of the signal processor.

The preferred design of the device follows the form of a microchip, which is connected to a computer through a microbus interface. Through the microprocessor contained in the chip, the programmed compensation values stored in the EEPROM can be called up through the internal bus, processed, and then the programmable analog-digital converter signal-fitting device (PADCAS) can be switched on, which in turn automatically undertakes the signal compensation during the analog-digital conversion.

BRIEF DESCRIPTION OF THE DRAWINGS

Further advantages, details and characteristics of the disclosure follow from the descriptive examples provided in the drawings. Among these are.

DESCRIPTION OF THE PREFERRED EMBODIMENTS

Hereafter, reference will be made especially to FIGS. 1 and 2, which display a general block diagram with the related schematic.

In accordance with these diagrams, the device consists of a signal processing switch 1, which is formed as a semi-conductor chip. An electrical erasable and programmable storage unit for constants, EEPROM 4, is connected to this through interface 2. Signal-processing switch 1 is further connectable through an additional interface 3 to an external microprocessor or microbus. The connections and/or switches designated by alphanumeric combinations in FIG. 1 are listed and explained further in the tables provided in the annex, to which reference is made.

Figure 1:
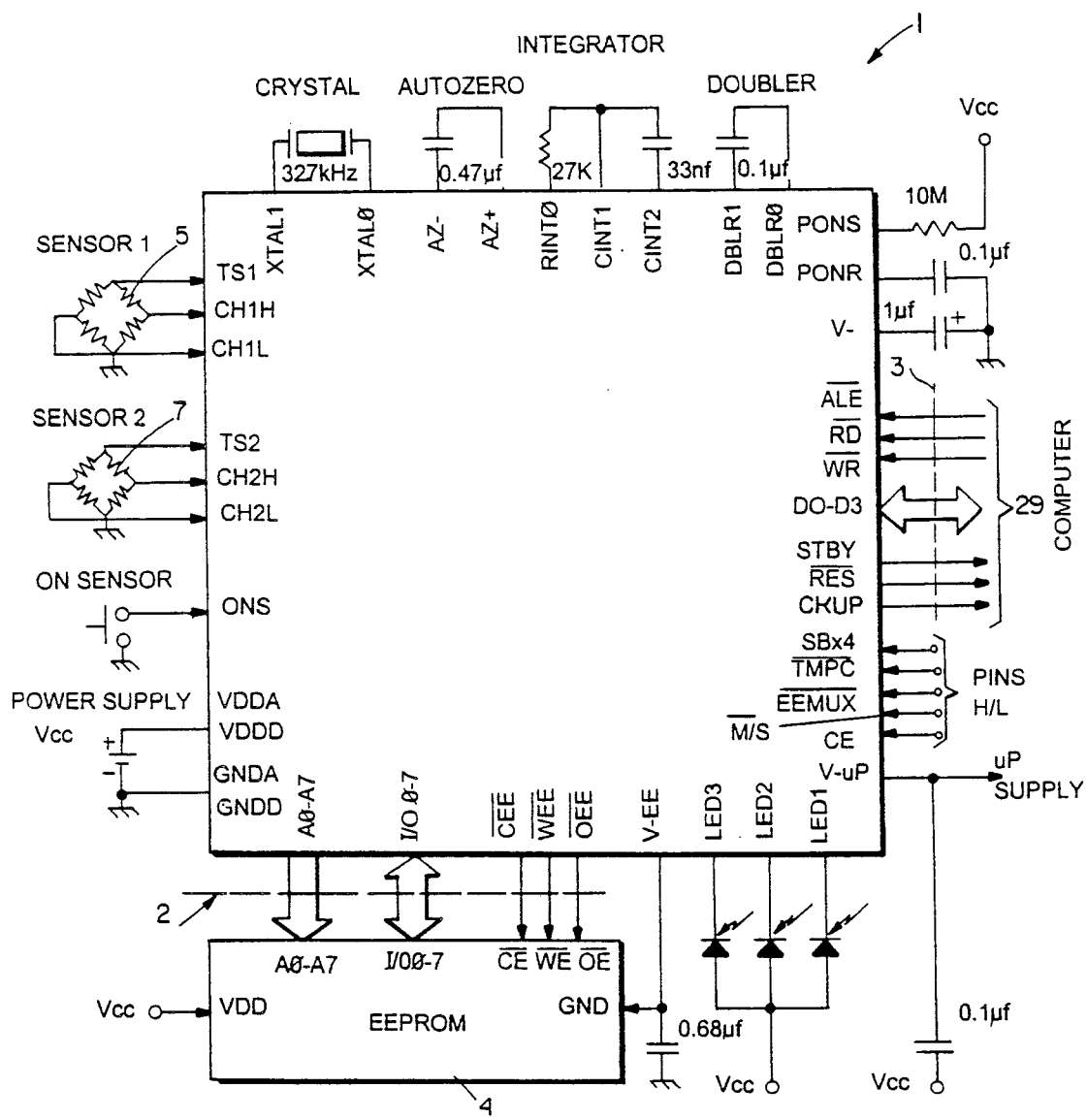
FIG. 1: A schematic diagram of the device for measurement error compensation, signal-shaping and/or processing.

Two sensors can be connected to the switch shown in FIG. 1. The sensors can be operated alternatively or even interlocked, and thus simultaneously, in staggered fashion, e.g., with a reference pressure measure.

The main power supply $V_{cc}$ is connected to the input VDDA/VDDD as well as to the potential connection GNDA/GNDD. The sensor bridge voltage feed can be preselected and adjusted, through a 4-bit register decoder, 9, and a down-stream power source step-selector, 11, in 16 programmable discrete steps, which are selectively applied to the respective measurement bridges of the first or second sensor, 5 and/or 7, through an internal power source 12 and the first multiplexer 13. These 16 discrete programmable power levels are also used to adjust the sensor in an 8-bit analog-digital range, when the temperature at the measurement bridge is measured by digital-analog comparison. The programmable power source is used, in addition, for adjusting the sensor signal with reference to the desired output voltage range. Further, a temperature compensation is possible, as will be explained later. As is generally the practice, the voltages at the sensors 5 and 7 respectively will be connected to the bridge through the TS1 or TS2 (Top of Sensor) connections and the opposite potential connection. The measurement signal coming across the measurement bridge is leg through the CH1H (Channel 1 High) connection and CH1L (Channel 1 Low) to the first multiplexer 13, and through a further multiplexer 15, to a buffer 17, as an intermediate storage. At the output of the buffer storage 17, an integrator step 21, followed by a comparator step 23, are added successively to form an analog-digital converter (abbreviated ADC).

Although on principle a variety of AD [analog-digital] converters can be employed, in the examples illustrated, an AD converter will be used which works in the so-called dual-slope integration mode.

For the basic construction and function of this kind of an AD converter, reference is made among other things, to the general state of the art, and especially to the book DE-B "Semiconductor Switching Technology" by U. Tietze and C. Schenk. 5th edition, 1980, beginning on p. 649 and especially on p. 658 to 664, and the book "Digital Switching and Switching Circuits" by Dr. Alfred Huethig Press, Heidelberg, 1982, pp. 431 to 453, and consideration is given to the totality of the contents of these works.

As follows from the above, the input of integrator 21 is connected to the output of buffer 17 through an input resistance 22 (in the example, 27 KOhm). Between the input and output of the OP-amplifier 21, is a condenser 24 (in the example 33 nF). The output of the integrator leads to a comparison circuit, whose output is connected to a master control logic 25, referred to hereafter by the abbreviation MCL. The basic mode of operation of this AD converter will be described in greater detail below.

Since the further construction of the signal processing switch 1 is not hard-wired, but is constructed in a programmable fashion to achieve a great range of adaptability, a 4-bit wide bidirectional microbus is provided in the example, so that the bits can be cyclically displaced through the 4-bit register.

A connection is possible from the internal bus of signal processing switch 1 through interface 3 to an external microprocessor or to an external device for further data processing, by means of microprocessor connection 27 as input-output connection through D0-D3 channel 29. Interface 3 is also assigned to the address register of the release impulse ALE (ALE-STROBE), the read-input impulse (Read Strobe) for bus read, and the write input impulse WR (Write Strobe) for bus write. The suitable input value from the D0-D3 channel is read into the address storage through the ALE impulse, which in turn activates the selected D-storage for subsequent reading or writing by means of the MCL logic. By means of the RD strobe impulse the suitable output signal is applied to D0-D3 channel 29 through an appropriate activation of the D-storage at its output. Two 4-bit instruction registers are also provided as internal logic in signal processing switch 1. These registers are described with a 4-bit logic control word, LCW. The 4-bit LCW words are then decoded by two, 4-bit command word decoders, 31, and converted into output signals which switch individual control components of the mCL master control logic, 25. Each LCW control word remains unchanged, until a further change occurs.

In order to be able to operate the AC converter in a programmable fashion in the illustrated example, provision is made of an 8-bit digital-analog converter with a resistor chain in addition to the 16-step, programmable power supply selector 11. The DA converter, 33, is not only used for temperature measurement but also as a supplement in signal compensation, i.e. once for automatic "null-point compensation" and then for gross adjustment of the full scale range in the first neutral phase and positive slope phase. An additional programmable ADC counter, 35, is used to augment this 8-bit DA converter, 33, in order to adjust the length of the time signal T during the integration of the negative slope phase, and to undertake a precision full scale balance with 12 bits. For this purpose, the ADC counter, 35, and two 8-bit registers (in box 36), used for null-point and gross sensitivity adjustments, are connected with the input of the DA converter, 33, through three 8-bit multiplexers (in box 38).

During the positive slope phase the programmable 12-bit counter 35 is used in order to be able to select between 8-, 10-, or 12-bit resolution, in which the clock input is used in the manner of a frequency splitter and the length of the positive phase, corresponding to the binary equivalent of the A-D converted sensor signal, is measured. During the digital-analog comparison of the temperature signals of the measurement bridges, the 12-bit counter is used to transform the 8-bit digital-analog signal, until the comparator, 23, cuts off the counting process by means of the MCL logic, 25, upon reaching the measurement bridge voltage. At this moment, the counter position corresponds to the 8-bit binary equivalent of the temperature.

The further course of the switching follows automatically. By this means, the conversion status values are registered in a logic status output register, 37. The output of the selected 12-bit ADC counter 35 is transferred to three 4-bit ADC output registers (in box 39). After this, all ADC switching circuits are shut off, while all appropriate ADC values and their logical statuses re accessible to designated output registers 37 and 39 by readout.

A five-volt power supply, 50, is provided for the supply of EEPROM 4, which determines the adaptation level of the interface 26. The read and write process of EEPROM 4 is accomplished through LCWs which are loaded in instruction register 31, and are operated and connected through the signal processing switch, 1. The EEPROM includes, as an example, two internal 8-bit registers. Each register can include two sets of 4-bit registers, which are accessible through the 4-bit bus. By pressure on the input EEMUX it is possible that the addresses and data can be multiplexed to EEPROM 4. Since the signal processing switch 1 is constructed in a programmable fashion, the external EEPROM 4 is connected to the internal bus by means of an interface file, 26, a data address multiplexer, 28; two 4-bit input and 8-bit output registers, 30; and an additional 8-bit input and two 4-bit output registers, 32.

Finally, the contrast of an LCD [light controlled diode] display can be optimized independent from temperature and battery fluctuations. A temperature compensation 41 is provided for this purpose for the microprocessor interface 3. By this means, an automatic adaptation is provided, e.g., from −20° to 70° C., in which the temperature compensation switch displays a temperature coefficient of 14 mV/° C.

At 25° C., for example, a three volt power supply is produced. In addition, the external potential GMD as well as the microprocessor LCD drive, etc. need only be connected to the V-UP peg, and the TMPC peg depressed. The withdrawal of the TMPC pin shuts off the temperature compensation switch circuit.

Finally, several LED [light emitting diode] driver circuits, 49, can be provided, in order to activate different LEDs, corresponding to different functions, with differing flash frequencies, but this will not be addressed in further detail below.

Further a sensor-on switch circuit is provided, which compares the value at the external ONS peg with an internal 600 KObm resistance. Any resistance value below 550 KObm switches the sensor-on switch circuit 45 to its anticipated value. This switch circuit 45 can be programmed to be turned on or off through an appropriate LCW command word. By pressure on the M/S [master/slave] peg, the signal processing circuit 1 is operated in the so-called master mode. In addition, a commutator can be used in power-down operation in which, e.g., the switch circuit only requires 0.5 uA. The switch can be reactivated by the previously mentioned sensor-on switch 45. Further, the crystal oscillator 47, abbreviated XTAL, is stopped and the microprocessor potential port and all other outputs set at power supply levels, with the exception of the sensor-on switch which remains activated.

With a resistance of less than 500 KObm, the switch circuit 45 is reactivated, as mentioned, so that the crystal oscillator 47 begins to oscillate. Also, the other alternations are canceled.

The sensor-on switch, 45, has a hysteresis of 50 kObm. This permits switching on by bypassing the ONS pin and the GDS pin (potential pin) through moisture detectors or in employment as a water sensor.

Figure 2:
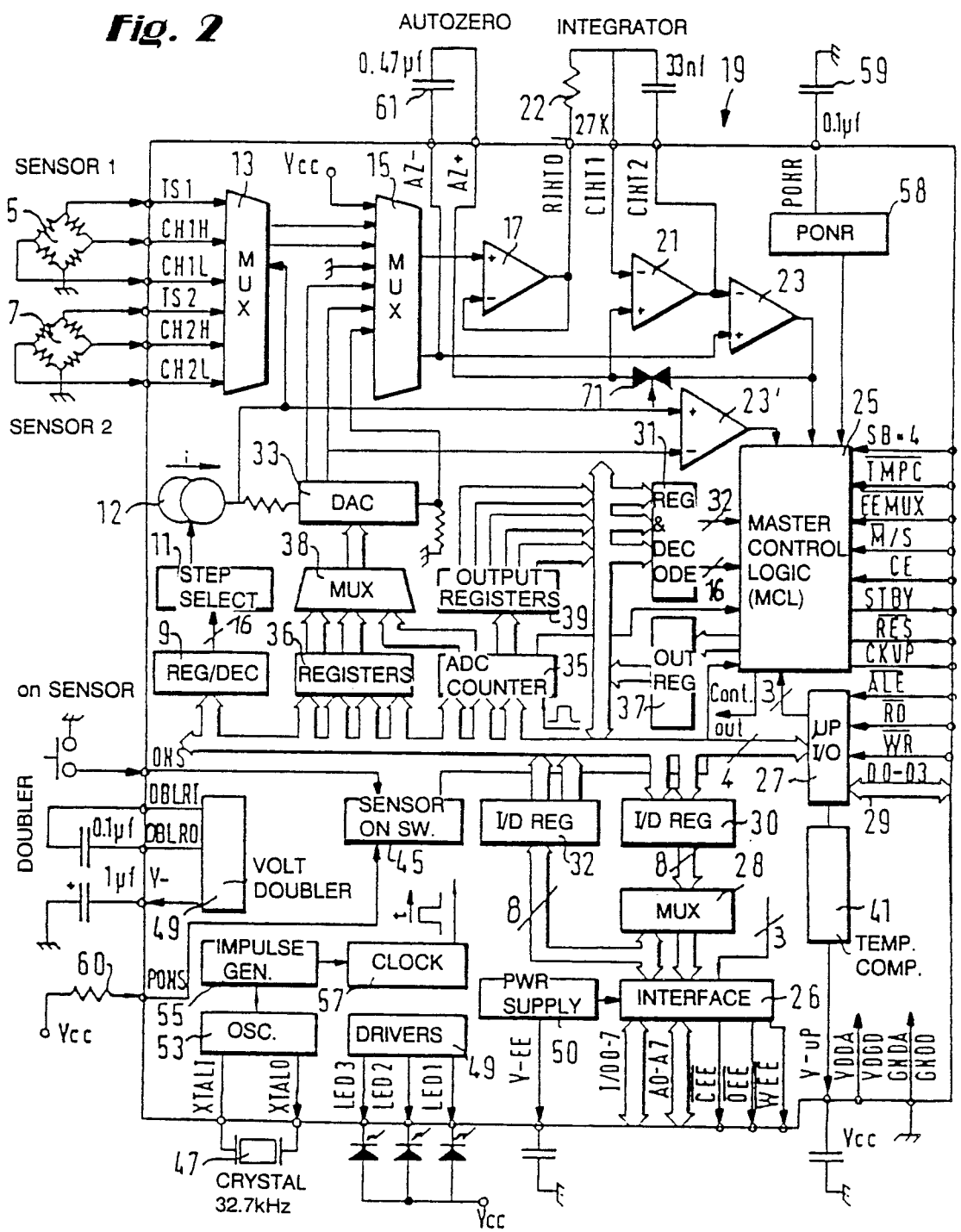
FIG. 2: A block diagram of the device portrayed in FIG. 1.

In FIG. 2 a voltage doubler, 49, is shown, a negative voltage is created in a direction opposite to that of the power supply, The effectiveness lies at 95° or better. The negative port, V-EE, for the EEPROM power supply used this negative voltage, in order to provide a 5 volt power supply between the positive and negative ports VDD and V-EE (EEPROM power supply 50).

An initial bias voltage switching circuit, 45, includes several reflex voltage switches. Each of the initial bias voltage circuits can create all the power levels necessitated during operation and can carry the coarse power impulse through to supply the sensors.

The already-mentioned crystal oscillator, 47, is connected to an oscillator circuit, 53, through two ports, XTALI and XTAZLO. In typical fashion, not to be further described here, a scanning impulse generator, 55, and a clock frequency generator, 57, are also operated by these.

An externally-grounded condenser 59, in connection with an internal 1 MObm 60 (PONR circuit 58) supplies a specified output to all registers, outputs of the internal logic circuits, and the internal power supply and performs the automatic reset function in initial power loading.

In addition -as already mentioned- a power down switch is possible, with which everything is turned off, with the exception of the sensor-on switch 45, and the signal processing switch 1 uses less than 1 uA of power, dependent upon resistance 60 which is connected to the PONS pin. A resistance of 10 MObm leads to 0.6 uA power consumption, and 20 MObm to 0.3 power consumption.

Finally, various operational modes are possible with the signal processing circuit 1, i.e., the so-called master or slave mode. The subordinate slave mode is made possible by withdrawal of the M/S peg. The signal processing switch 1 is controlled through the circuits of the CE release. As long as the CE peg is depressed, the output bus remains in the three conditions, and does not react to the ALE, RD or WR impulses. Through series and simultaneous switching of several signal processing switches 1, the so-called slave mode can be executed.

By withdrawal of the CE pin, unrestricted operation can be carried on through the microbus interface 3. The master mode serves first to minimize the energy consumption of the microprocessor instruments. For this reason, the device described here switches the power supplies of the remaining components by software commands whereby external switch circuits between the general VDD power supply and the V-UP pin are switched as general GND potentials. The internal FET switch for the power adjustment at the V-UP power supply has an internal On-resistance of less than 100 Obm and cna control external circuits of up to 5 mA at 3V.

The so-called master mode is made possible by depressing the M/S pin and by withdrawing the CE pin.

Error compensation with the previously-described signal processing switch occurs basically in two steps.

The first step concerns the so-called calibration phase, in which the compensation and signal processing values are obtained and stored. The second phase concerns the actual pressure signal measurement and processing, with regard to error compensation.

The calibration phase will be explained by reference to FIG. 3.

Figure 3:
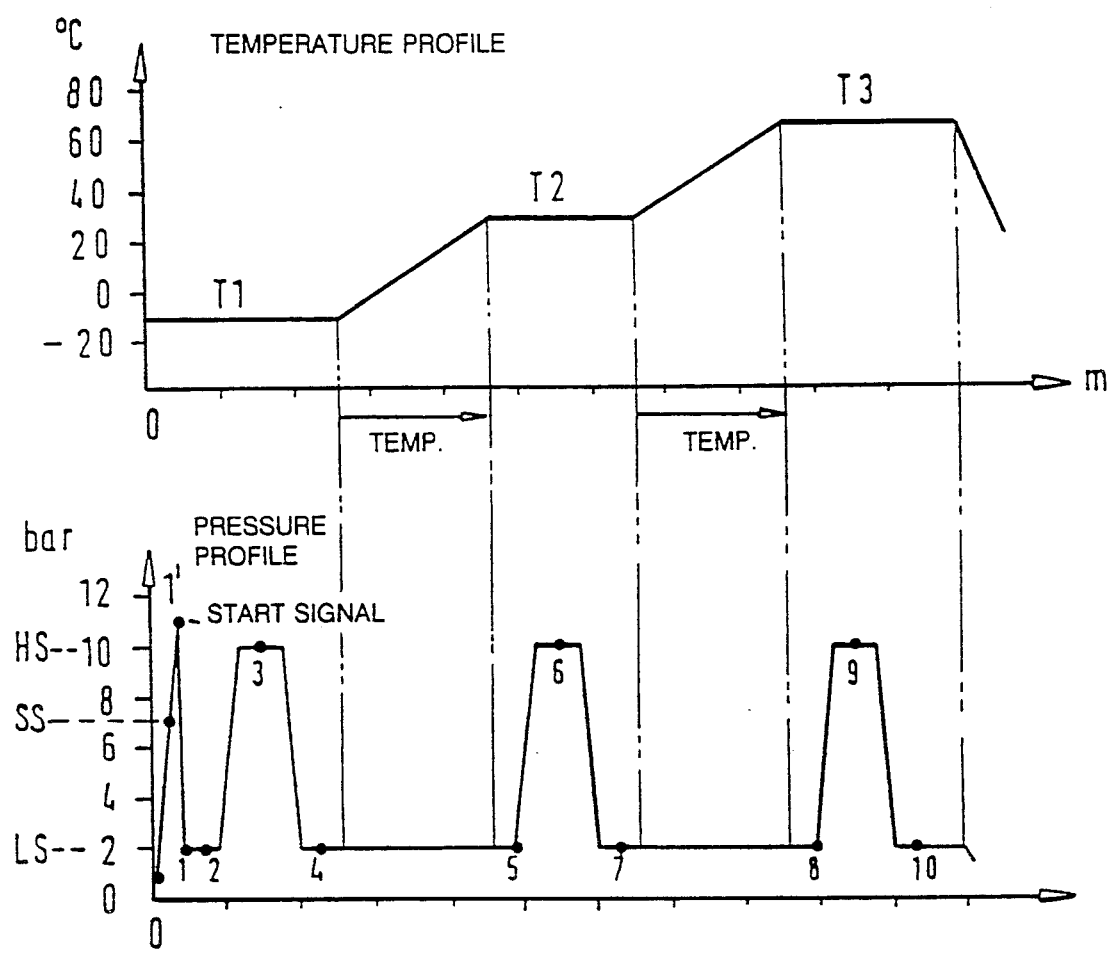
FIG. 3: An example of a temperature time profile, and an example of a pressure-time for plotting norms and calibration values.

For this purpose, the measurement switch with the connected sensor, e.g. the first sensor 5, is exposed to a time-pressure curve, as shown in FIG. 3. At the same time a temperature-time curve is executed as is shown in FIG. 3. Naturally other temperature/pressure/time profiles are possible, in order to undertake linear corrections and curve-fitting.

Referring to FIG. 3, additional values were obtained at the individual positions 1 through 10, computed and stored as adjustment values. The software ensures that the beginning of the calibration and standardization phase is recognized at 1' and the individual measurement points are then controlled by the software, automatically registered, and interrogated, in order to register, e.g., in an EEPROM with 31×8 bits, the appropriate values at positions 0 through 10 with which, e.g., a 10 bar pressure signal can be compensated with a 10-bit resolution l(1 bit=0.01 bar or 0.1% of the maximum scale signal). At the first, i.e., the lowest temperature level, the voltage is first adjusted even by "0" in FIG. 3. After recognizing the start signal, SS which is recognized at the latest at position 1' the first temperature is measured and stored. Thereafter, at 2, the offset coarse signal adjustment and storage readout follows. Then with increased pressure HS the full-scale coarse signal is adjusted and its adjustment parameters for temperature at T1 ate stored. From there on, with these and all further temperature readings, there follows a periodic FS fine adjustment ("3", "6", "9"), in which at any given time the succeeding temperatures at low pressure levels LS (5, 8) are measured and stored, and with succeeding higher pressure levels HS the full-scale fine adjustment is applied to the appropriate temperature, and the values are stored. Finally at low pressure levels LS(4, 7, 10) the offset pressure is measured and stored once more. The switch is exposed to various required temperature and pressure values, for which the profile sequence for temperature and pressure must be fixed as normative values in the micro-processor, so that the program can follow the calibration profile.

The advantage in this connection lies in the fact that no separate temperature sensor is required for temperature compensation for the measurement bridge. Only the bridge feed power is measured which is equal to the temperature. As is seen in the described profile, the appropriate values can be determined and stored for, e.g. three temperatures, and the temperatures and temperature compensation values lying between are obtainable through interpolation.

A feed voltage compensation is also provided. During the operation of the device it is certainly possible that the feed power oscillates, for whatever reason. This kind of oscillation of the feed power supply would cause a corresponding contamination of the measurement results. For this reason the automatic power supply compensation functions so that voltage oscillations of up to 1 volt are automatically compensated through the IC [integrated chip]. An even larger voltage fluctuation could be compensated in a fashion analogous to the temperature compensation.

For this purpose, a $V_{CC}$ input as well as a potential connection is provided in the second multiplexer 15. The compensation follows in a fashion analogous to temperature compensation, where the feed voltage in the calibration phase is turned into binary equivalents and then e.g. during the measurement phase, it taken into account by computer processing to attain the compensation by interpolation.

After the appropriate calibration compensation and signal processing values are stored in the EEPROM 4, an appropriate pressure measurement and pressure signal processing can be undertaken. At the same time, signal compensation and signal processing occur during digitization of the analog measurement signal.

Signal compensation and signal shaping are undertaken at the same time in three phases by the analog-digital converter 19.

In the first, or so-called null-point or neutral phase, only internal voltage displacements, long-term instabilities, or other errors or deviations of the internal circuitry are corrected, but above all, the start point of the integrator is raised to a previously-measured and programmed voltage level, through which the sensor bridge deviation voltage ($S_o$) is eliminated. The appropriate positive or negative compensation voltage is created through the 8-bit DAC, by means of a program. Before the second phase starts, the sum of all deviations is loaded into the null-point correction condenser 61 and applied to the positive input port of the ADC integrator 21 as a virtual null-point voltage $U_z$. By way of further explanation, it is noted that a commutator, 71, which is introduced into the circuit between the plus input indicator, 21, and the output of comparator 23 is required in order to set the indicator at "null" in the first phase. In addition, the previously mentioned connective circuits can be switched on/off by means of the commutator 71. During the first indication phase the switch stands at "off," while in successive indication phases it is switched to "on."

In the second phase, i.e., the phase with a negative slope, the voltage difference, $U_e$, between the unknown sensor input signal, $S_e$, and the sensor bridge signal deviation signal, $S_o$, is integrated for a preprogrammed period. The appropriate period is created by the programmable 12-bit counter 35. When, e.g., the 12l-bit counter is determined by means of a 10l-bit word, a negative slope phase with a time period variation of between 4.096 and 3.072 clock periods is possible. By this means, the counter cycle N is varied.

The programming of the time period of the negative slope phase is synonymous with a fine-tuning of the full-scale range, in that (for this example) 25% of the maximum negative phase length is adjusted and transformed.

The second phase is followed directly by the third phase with a positive slope, the length of which is variable. In this phase a reference voltage $U_r$ is again applied to the input port of the integrator, 21, in place of the sensor input signal difference $U_e$. The positive phase length depends on the magnitude of the voltage difference signal, preadjusted and preprogrammed within scale range, which provides the difference between the sensor signal and the sensor deviation signal ($U_e = U_e - S_o$). The variable positive slope phase determines the final ADC output signal with a view to a coarse adjustment of the scale range for adjustment to a desired measurement range.

During this positive slope phase, the preprogrammed reference voltage $U_r$, of opposite polarity, is integrated upwards to the input voltage $U_e$. The appropriate reference voltage $U_r$ is created by the internal 8-bit DAC 33 under control of the program, and automatically applied to the plus input pot of the integrator during the positive phase.

The internal counter is stopped by the comparator 23 when the output of the integrator has once more reached the virtual null voltage $U_z$. The counter output is read into the ADC output register 39 and the end-conversion signal (CC-conversion complete) is given. If the counter should reach 100% of the preprogrammed full-scale value (maximum clock period count), before the integrator reaches $U_z$, then the conversion overflow signal COV is produced and the integration is stopped. The COV and CC signals can be called up from the status output register. The status of the On-sensor signal is also brought to the status output register, and it too can be called up from the status output register.

Since signal fitting and signal scale range adjustment are iterative functions, the final ADC signal must be subjected to a mathematical fit, before it can be processed as a binary sensor output.

$$CLCADC = (ADCOUT - OFSSRD) \cdot \frac{HS - LS + LS}{FS - OS}$$

Where:
CLCADA = the computed ADC value
ADCOUT = ADC output value
HS = nominal high signal value
LS = nominal low signal value
FS = nominal value for the ADC output at FS (nominal full scale value)
OS = nominal value for the ADC output at LS (nominal value for the offset check)
OFSSRD = ADC output value at LS (offset signal for mathematical adaptation).

The conversion is simple, since it is only a matter of determining a linear equation.

It is clear from the described construction and function that, through programming alone, signal processing switch 1 is adaptable to the most varied and manifold tasks. A signal shaping precision that has not been considered attainable can be reached with minimum energy expenditure by signal processing and compensation during analog-digital conversion. By use of an internal bus unit, further problem-free signal processing can take place by means of an external microprocessor or microbus connected to an interface.

In FIG. 2, numbers on diagonal lines indicate the number of separate circuits or, in the case of a bus, the number of circuits included in the bus.

I claim:

1. Apparatus for measurement signal compensation and/or shaping of analog measurement signals comprising:
   an analog-to-digital converter operating in a dual slope integration mode, said converter including an integrator having an input port for receiving the analog measurement signal and a comparator connected thereto downstream of said integrator;
   a programmable means connected to a second input port of said integrator for providing a preselectable zero point compensation voltage to said integrator and for providing a preselectable reference voltage during a positive slope phase of integration;
   a programmable counter for providing a selectable time of integration for said analog-to-digital converter during a negative slope phase; and
   said programmable means being microprocessor controlled and including a digital-to-analog converter for producing said zero point compensation and reference voltages in response to digital data provided by a data memory or via an interface device.

2. An apparatus as in claim 1 wherein said second input port of the integrator includes a capacitor which is charged to said preselectable zero point compensation voltage.

3. An apparatus as in claim 1 wherein said memory is connected to said digital-to-analog converter and the data stored therein includes digital zero point compensation values.

4. An apparatus as in claim 3 wherein the data stored in said memory includes digital reference voltage values.

5. An apparatus as in claim 4 further including a multiplexer connected between said memory and said digital-to-analog converter for transmitting the digital zero compensation and reference voltage values stored in said memory.

6. An apparatus as in claim 1 wherein said memory is electrically erasable and programmable read-only memory device.

7. An apparatus as in claim 1 wherein said memory is an electrically erasable and programmable read-only memory device which is integrated on a semiconductor board with the remainder of said apparatus.

8. An apparatus as in claim 1 wherein temperature compensation values measured as temperature-equivalent bridge-feed voltages are stored in said data memory, said data memory comprising an electrically erasable and programmable read-only memory device.

9. An apparatus as in claim 1 further including a programmable voltage source for power supply and range selection of plural input sensors.

10. An apparatus as in claim 1 wherein an additional power supply voltage is provided, through which input signal contamination caused by voltage fluctuations is compensated.

11. A method for measurement signal compensation and/or shaping of analog measurement signals, said method comprising:
    providing an analog-to-digital converter operating in a dual slope integration mode, said converter including an integrator having an input port for receiving the analog measurement signal and a comparator connected thereto;
    providing under programmable microprocessor control a preselectable zero point compensation voltage to a second input port of said integrator for setting the integration starting point;
    providing via a programmable counter a selectable time of integration for the voltage difference at said integrator ports during a negative slope phase of integration; and
    providing under programmable microprocessor control a preselectable reference voltage for application to said second port of said integrator during a positive slope phase of integration,
    wherein digital data is provided under control of said microprocessor from a data memory or an interface device and said data are representative of said preselectable zero point compensation and reference voltages and said data are converted to analog voltages before being applied to said integrator.

12. The method of claim 11 wherein prior to analog conversion of said digital data representative of zero point compensation and reference voltages said data is stored in an electrically erasable and programmable memory device.

13. The method of claim 11 further including the step of multiplexing the transmission of said digital data to a digital to analog converter for producing said preselectable zero point compensation and reference voltages.

14. A method as in claim 11 wherein said preselectable zero point compensation voltage is applied to said integrator by charging a capacitor connected to said second port.

15. A method as in claim 11 further including the step of scale range adjustment of the analog-to-digital converter output in accordance with the following:

$$CLCADA = (ADCOUT - OFSSRD)(HS - LS)/(FS - OS) + LS$$

wherein
CLCADC = computed ADC value (analog digital converter value)
ADCOUT = ADC output value
HS = nominal high signal input value
LS = nominal low signal input value
FS = rated value for the ADC output in the case of FC = (nominal full scale value)
OS = rated value for the ADC output in the case of LS
OFSSRD = ADC output value in the case of LS.

16. Apparatus for accomplishment of the processing of analog measurement signals wherein an integrator in an analog-to-digital converter is operated in the positive slope phase with a discretely preselectable reference voltage;
    means for adjusting the reference voltage through a digital intermediate storage unit, and
    a digital-to-analog converter is connected to an intermediate storage unit to create an analog reference signal for full-scale coarse adaptation of the converter relative to said analog measurement signals.

17. Apparatus for accomplishment of the processing of analog measurement signals wherein an integrator in an analog-to-digital converter is operated in the positive slope phase with a discretely preselectable reference voltage;
    means for adjusting the reference voltage through a digital intermediate storage unit, and
    a digital-to-analog converter is connected to an intermediate storage unit to create an analog reference signal for full-scale coarse adaptation of the converter relative to said analog measurement signals and
    wherein the digital-to-analog converter is inserted down-stream from the intermediate storage unit for creation of an analog null-point compensation value.

18. Apparatus for accomplishment of the processing of analog measurement signals wherein an integrator in an analog-to-digital converter is operated in the positive slope phase with a discretely preselectable reference voltage;
    means for adjusting the reference voltage through a digital intermediate storage unit, and
    a digital-to-analog converter is connected to an intermediate storage unit to create an analog reference signal for full-scale coarse adaptation of the converter relative to said analog measurement signals and
    a multiplexer provided as a commutator to the input of said digital-to-analog converter, the input of the multiplexer being connected with an output port of a cycle counter and said reference voltage storage.

19. Apparatus for carrying out the processing of analog measurement signals with an analog-digital converter, including an integrator and a comparator inserted downstream, in which the analog measurement is applied to one input port of the integrator and at a second input port of the integrator a preselectable voltage signal for signal processing is applied so that the integrator is driven in the negative slope phase of integration for a preselected time and so that the integrator is driven in the positive slope phase of integration by a separately preselected reference voltage of opposite polarity at said second input port, and
    wherein the preselected signal processing values are called up from an electrically erasable and programmable constant storage unit.

20. Apparatus according to claim 19 wherein the preselected signal processing values are called up from an electrically erasable and programmable constant storage unit which is integrated on a semiconductor plate with the remainder of said apparatus.

21. Apparatus according to claim 19 further including an interface for the connection of an external microprocessor to control said signal processing of the digitized measurement signal.

22. Apparatus according to claim 19 wherein a programmable voltage source is provided for power supply and range selection of plural input sensors.

23. Apparatus according to claim 19 wherein temperature compensation values, which are measurable as temperature-equivalent bridge-feed voltages, are stored in an electrically erasable and programmable constant storage unit.

24. Apparatus according to claim 19 wherein an additional power supply voltage is provided, through which input signal contamination caused by voltage fluctuations is compensated.

* * * * *